United States Patent
Smith, III

(10) Patent No.: US 6,215,295 B1
(45) Date of Patent: Apr. 10, 2001

(54) PHOTONIC FIELD PROBE AND CALIBRATION MEANS THEREOF

(76) Inventor: Richard S. Smith, III, 7501 Ballyshannon Ct., Springfield, VA (US) 22153

(*) Notice: Subject to any disclaimer, the term of this patent is extended or adjusted under 35 U.S.C. 154(b) by 0 days.

(21) Appl. No.: 09/121,877

(22) Filed: Jul. 24, 1998

Related U.S. Application Data

(60) Provisional application No. 60/053,705, filed on Jul. 25, 1997.

(51) Int. Cl.$^7$ ............. G01R 23/04; G01R 31/308; G01R 35/00
(52) U.S. Cl. ............... 324/95; 324/753; 324/601
(58) Field of Search .............. 324/95, 96, 753, 324/601; 359/245, 251, 109, 195, 248, 154, 189, 159, 152; 250/227.17

(56) References Cited

U.S. PATENT DOCUMENTS

| | | |
|---|---|---|
| 4,833,476 * | 5/1989 | Dutcher ............... 342/351 |
| 4,928,067 * | 5/1990 | Lind ..................... 324/96 |
| 5,231,346 * | 7/1993 | Gassmann ............. 324/95 |
| 5,389,782 * | 2/1995 | Hilliard .............. 250/227.17 |
| 5,701,082 * | 12/1997 | Rogers ................ 324/628 |

* cited by examiner

Primary Examiner—Safet Metjahic
Assistant Examiner—Anjan K Deb

(57) ABSTRACT

A photonic radio-frequency (RF) field probe for detecting and measuring RF fields incorporates a probe head, a fiber cable and a photodetector/power-laser unit. An antenna drives a small, fiber-coupled laser, biased by a fiber-coupled optical power converter through series resistors, together with electrical connections and supporting apparatus. Methods of calibration include use of a reference oscillator in the probe head, use of the relationship between optical power sent to the optical power converter and resulting photodetector signal, and measurement of signal-fiber attenuation from light reflected by the laser in the probe head. Other probe embodiments utilize a reflective multiple quantum well modulator and embodiments which measure all three directional components of the RF field.

17 Claims, 10 Drawing Sheets

PHOTONIC FIELD PROBE AND CALIBRATION MEANS THEREOF

This application claims the priority of U.S. Provisional Patent Application Serial No. 60/053,705, filed Jul. 25, 1997.

The United States Government retains limited rights in this application pursuant to the following Small Business Innovative Research Grants: Navy Contract No. N00421-97-C-1086 (SBIR Topic N96-218); Navy Contract N00164-97-C-0056 (SBIR Topic N95-066); U.S. Air Force Contract F30602-97-C-0160 (SBIR Topic AF97-051); and PHS/NIH Grant NHLBI 2 R44 HL54984-01A1.

FIELD OF THE INVENTION

The present invention relates generally to photonic devices or systems capable of detecting or measuring radio frequency (RF) or other rapidly time varying electromagnetic fields, and to methods of calibrating such probes.

BACKGROUND OF THE INVENTION

Photonic fiber-optic probes or sensors are useful in the measurement of RF fields because they minimally perturb the fields being measured, have low volume and weight, extensive bandwidths, and provide minimal thermal expansion of the signal transmission path, which facilitates reliable phase measurements. Prior fiber-optic probes have required both an expensive (usually high-power, low noise, and expensive-to-fiber-couple-to) laser and a separate sensing transducer. The transducer is typically an electro-optic modulator, for probes which probe electric fields, or a Faraday-effect modulator for probes which probe magnetic fields. These prior probes can be subject to calibration drifts due, for example, to temperature effects or fiber bending, because they include no means of checking or monitoring the sensitivity of the probe to RF fields while in operation. In order to avoid the use of field-perturbing metal wires or large and perturbing batteries, which must be replaced or recharged, these prior probes, further, have not been able to take advantage of modulators or directly-modulated lasers which require electrical biases (with one exception: U.S. Pat. No. 5,389,782 which employs an electro-optic modulator and an optically-powered amplifier). These prior-art probes further typically require expensive polarization-maintaining fibers which can also cause calibration drifts due to polarization cross-talk.

A prior voltage probe, as opposed to a field probe of the type shown in U.S. Pat. Nos. 5,583,444 and 5,703,491 used a directly-modulated laser in the probe head. This probe was limited to the capacitive pick up of voltages generated in devices on a surface (integrated circuits in particular) and to embodiments utilizing a constant current source to bias the lasers or which included placing and positioning means. No antenna capable of picking up free-space RF fields was involved—only voltage "detectors" capable of capacitively coupling to voltages relative to ground generated on a surface. The bias power was not provided optically, so metal conductors (which would grossly perturb free-space RF fields) were required. Further, because a constant current source was used, variations in temperature could cause significant changes in probe sensitivity by changing the slope of the laser power vs. laser input current curve.

A fiber-optic link (U.S. Pat. No. 5,739,938), which is not an RF field probe, but which could potentially be used as such if connected to an appropriate antenna, used a directly-modulated laser and an optically-supplied DC power source. The transmitter (main part of the probe head in a probe configuration) of this link was limited, however, by the inclusion of a PIN photodiode in the "laser module" together with a laser power regulator in the transmitter portion in all embodiments. These parts require a relatively large amount of power. The inclusion of this circuitry in the transmitter increases its size, weight, and electrical power consumption. Moreover, since this power was supplied by inefficient optical means (normally involving the loss of around 150% of the power consumed in the optical-to-electrical power converter alone), the total power consumption is very high. Moreover, much of this power must be dissipated within the transmitter itself, leading to thermal management complexities. The increased transmitter size, weight, and power consumption are problems in probes used for measurement purpose and, especially, in applications such as phased-array radars, where a very large number of such transmitters are involved. In addition, while the PIN photodiode and power regulator are used to keep the light power generated by the laser constant, there is no provision made to compensate for changes in the slope of the laser power vs. laser input current curve or in fiber coupling or transmission losses-the parameters on which the probe or link sensitivity is dependent. These parameters can change with environmental effects such as temperature independently of laser power. Furthermore, the many different parts, including the PIN photodiode, the power regulation circuit, and parts used for fiber coupling, are exposed to these same environmental effects possibly including, in addition to temperature, vibration, dust, humidity, and electromagnetic noise. This link is also limited to transmitters which incorporate an RF amplifier, which adds further complexity, volume, weight, and inefficient power consumption, as well as further susceptibility to various environmental effects, and is not needed in many probe applications.

SUMMARY OF THE INVENTION

Therefore, it is a general object of the invention to provide an improved RF field probe head of small size which does not significantly affect the field being measured.

Another more specific object of the invention is to provide an RF-field probe using a laser, with or without an RF amplifier, in the probe head which is modulated in response to RF fields, thus eliminating the need for both an expensive high-power, low-noise, high-stability laser at the receiver end along with an expensive sensing transducer, such as an electro-optic modulator, in the probe head.

A further object of the invention is to provide an RF-field probe head in which electrical biases are supplied optically, eliminating the need for field-perturbing metal conductors or large, field-perturbing batteries, which must be replaced or recharged.

Yet another object of the invention is to provide an RF-field probe and fiber-optic link using a directly-modulated laser, with or without an RF amplifier in the transmitter, which is optically powered, but which does not require a PIN diode or a power regulator in the transmitter, thus allowing minimum volume, weight, and power-consumption, along with maximum power efficiency.

It is also an object of the invention to provide an RF probe and fiber-optic link for which the amplitude calibration can be monitored and, in some cases, corrected for with minimal components and circuitry in the probe head, and which employs components and circuitry which are readily protected from or compensated for environmental effects such as temperature, vibration, dust, humidity, and electromagnetic noise, and which uses the actual system photodetector in providing this monitoring and/or correction.

Another object of the invention is to provide an RF-field probe using an inexpensive, easy-to-couple-to, low-threshold current, efficient vertical-cavity-surface-emitting laser (VCSEL), with or without an RF amplifier, in the transmitter.

A further object of the invention is to provide an RF-field probe which uses an inexpensive, easy-to-couple-to, low-drive-voltage reflective multiple-quantum-well modulator.

An additional object of the invention is to provide an RF-field probe which can be used to detect and measure either electric or magnetic fields over a wide frequency range, depending upon the particular embodiment, from near DC to well over 18 Ghz.

Another object of the invention is to provide an RF-field probe which is also capable of detecting or measuring all three directional components of an RF field.

Yet another object of the invention is to provide an RF-field probe which is simultaneously able to approximately determine the ambient temperature at the probe head.

It is also an object of the invention to provide an RF-field probe which does not require expensive, polarization-sensitive polarization-maintaining fibers.

A further object of the invention is to provide an RF-field probe which does not incorporate an RF amplifier, which adds complexity, volume, weight, inefficient power consumption, and further susceptibility to various environmental effects, in the probe head for probing applications where the added sensitivity provided by such an amplifier is not needed.

Another object of the invention is to provide an RF-field probe which matches the impedance of a small antenna well, thus providing good frequency response, including at very low frequencies, without an amplifier in the probe head.

These objects and others which will be apparent to those skilled in the art upon review of the specification, drawings, and claims, are achieved in a preferred embodiment by providing a photonic radio-frequency (RF) field probe for detecting and measuring RF fields which incorporates a probe head, a fiber cable and a photodetector/power-laser unit. An antenna drives a small, fiber-coupled laser, biased by a fiber-coupled optical power converter through series resistors, together with electrical connections and supporting apparatus. Methods of calibration include use of a reference oscillator in the probe head, use of the relationship between optical power sent to the optical power converter and resulting photodetector signal, and measurement of signal-fiber attenuation from light reflected by the laser in the probe head. Other probe embodiments utilize a reflective multiple quantum well modulator and embodiments which measure all three directional components of the RF field.

DETAILED DESCRIPTION OF THE PREFERRED EMBODIMENTS

Figure 1:
FIG. 1 is a block diagram of an RF-field probe according to the invention.
Figure 2:
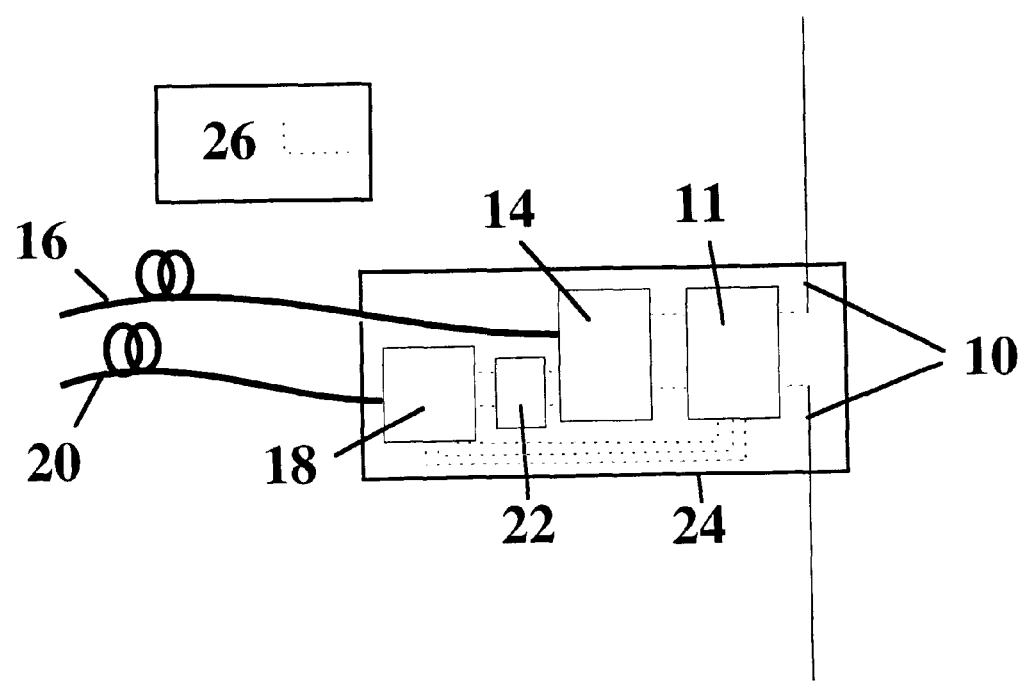
FIG. 2 is a block diagram of a preferred embodiment of an RF-field probe head according to the invention.

The present invention relates generally to a photonic radio frequency (RF) field probe. In a preferred embodiment shown generally in FIG. 1, the photonic RF field probe comprises a probe head 2, a fiber cable 4, and a receiver/power-laser unit 6. FIG. 2 shows a preferred embodiment of the photonic RF-field probe head 2, which comprises antenna 10, signal laser diode 14, signal fiber pigtail 16, optical power converter 18, power fiber pigtail 20, DC electrical network 22, supporting apparatus 24, and multiple electrical connections 26. In many embodiments an RF electrical network 11 is also included. All dimensions of the photonic RF-field probe head 2, with the possible exception of the antenna and the supporting apparatus, are preferably small compared with the wavelength of all RF fields for which probing is desired. In alternative embodiments, fiber pigtails 16 and 20 are connected directly to receiver/power-laser unit 6 without need for fiber cable 4.

Figure 6:
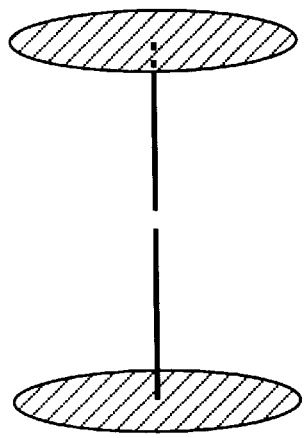
FIG. 6 is a perspective view of a capacitively loaded antenna used in the invention.
Figure 7:
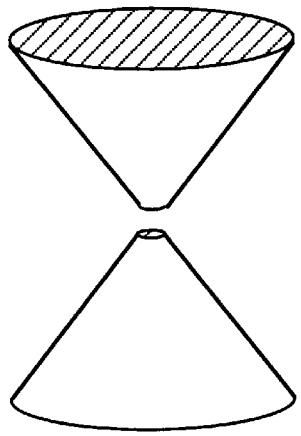
FIG. 7 is a perspective view of a biconic antenna used in the invention.
Figure 8:
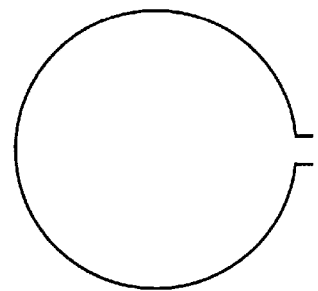
FIG. 8 is a perspective view of a loop antenna used in the invention.

Antenna 10 generates an electrical signal at a pair of output terminals proportional to RF electric or magnetic fields present at the antenna. Antenna 10 may be any standard antenna type but is preferably small. In the preferred embodiment of the RF-field probe head (FIGS. 2 through 5) the antenna consists of a wire dipole antenna, made of two thin, metal wires, placed end to end on the same axis, two ends of which are close together, constituting the antenna output terminals. The total length of such an antenna is preferably chosen by standard means to optimally respond to all RF fields of interest, i.e., for which probing is desired. In some embodiments, the antenna consists of such a metal dipole, made less than or approximately equal to half the shortest RF wavelength of such RF fields, and to which metal or partially-conductive plates, perpendicular to the axis of the wires have been attached to the ends of the wires opposite the output terminals for the purpose of improving the ability of the photonic RF field probe head 2 to probe low-frequency RF fields (the capacitively-loaded dipole of FIG. 6). Other embodiments utilize biconic dipole antennas (FIG. 7) for a wider bandwidth match to the signal laser diode impedance. Further embodiments utilize loop antennas in order to detect magnetic fields (FIG. 8). The invention is not limited to these preferred types of antennas, as any type of antenna capable of detecting RF fields may be used. In still other embodiments an RF input (e.g., a coaxial input, including coaxial inputs with a parallel resistor or other electrical network to provide a 50-ohm impedance match) is provided to allow connection to a general antenna or other RF source (making the probe a fiber-optic link).

In the preferred embodiment RF electrical network 11 provides only an electrical connection of antenna 10 and signal laser diode 14, and does not include any components. In other embodiments, the RF electrical network consists of a passive matching network. In some embodiments this network consists of a single capacitor in parallel with the signal laser diode for the purpose of achieving relatively flat frequency response over a broad bandwidth. This capacitor is preferably small, for example, a chip capacitor or else a capacitor fabricated directly on the substrate of signal laser diode 14. In other embodiments RF electrical network 11 consists of a transformer, for example, a ¼-wave transmission line transformer which optimally matches the impedance of antenna 10 to that of signal laser diode 14 over a limited bandwidth. The invention is not limited to these types of RF electrical networks. In still other embodiments, for example, the RF electrical network consists of many passive components (e.g., chip capacitors, inductors, and resistors) chosen to provide an approximately optimum impedance match between antenna 10 and signal laser diode 14.

RF electrical network 11 may also include a transistor RF amplifier for the purpose of providing RF voltage, current, and/or power at the network's output terminals which, when connected to the signal laser diode, are increased over the values which would be present at the output terminals of an entirely passive RF electrical network when so connected. The amplifier may comprise a single transistor (such as a field effect transistor) as the sole transistor and sole active device in the amplifier, and may have a circuit. In embodiments where an amplifier is included, the RF electrical network includes passive input and output matching, circuitry as well as DC bias or DC-power-supply input terminals along with DC bias or DC-power-conditioning circuitry needed for proper operation of the amplifier and/or isolation of the device supplying the DC electrical power. Bias for signal laser diode 14 is preferably applied through the amplifier rather than through DC electrical network 22. An example of such an amplifier is given by amplifier 14 in U.S. Pat. No. 5,739,938 to goutzoulis et al. where, in the present case, the transistor base bias voltage is provided through a series resistor connected to the center tap of a resistive divider connected across two output terminals of the optical power converter. In other embodiments the amplifier output is AC coupled and the signal laser diode is biased using DC electrical network 22 as described below.

Figure 9:
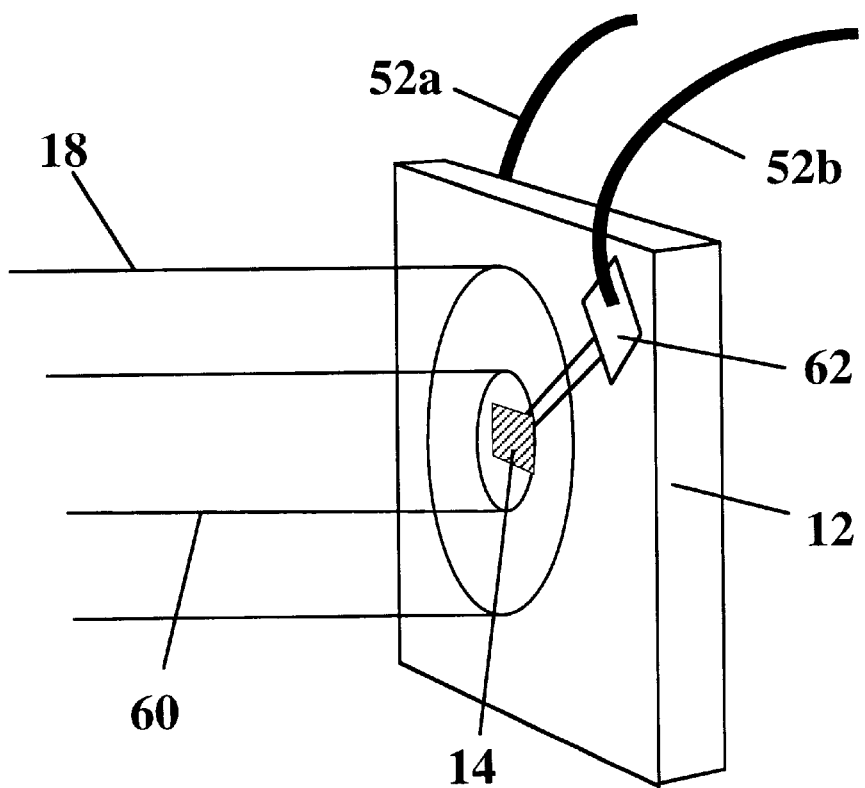
FIG. 9 is a perspective detail of a fiber coupling to a VCSEL on a substrate, as used in the invention.

Signal laser diode 14 is a means of generating an optical signal in proportion to an RF electrical signal present at the signal laser diode's input terminals. FIG. 9 shows signal laser diode 14 and its substrate in more detail. In a preferred embodiment, signal laser diode 14 is a vertical cavity surface emitting laser (VCSEL), although other types of semiconductor or diode lasers may also be used. Signal laser diode 14 is preferably in small die or chip form. Electrical connections 52a and 52b, consisting of thin metal wires, preferably gold or copper, are connected to bonding pads 62 on the front of signal laser diode substrate 12 and on the rear. A signal laser diode both generates and modulates light in response to the RF current through its input terminals, a substantial portion of which modulated light propagates into the signal fiber pigtail 16. VCSELs emit light normally from their surfaces facilitating the coupling of light into the fiber as described below. The signal laser diode selected for this application preferably has a high AC impedance (e.g., 300 Ω), requires a low bias current (e.g., 1-to-3 mA), a high slope efficiency, or change in emitted light power to change in applied voltage ratio (e.g., 2-to-5 mW/V), which depends minimally on temperature, a large voltage region over which this ratio is very-nearly constant, a small emitting surface (e.g., 4 μm squared), and minimal mirror electrical resistance. In alternative embodiments, the VCSEL is replaced with another type of semiconductor laser on a small substrate. In some embodiments where extremely small size and weight and minimum power consumption are not critical, the photonic RF probe assembly may include a thermal electric cooler to reduce temperature of the laser, also powered by optical power converter 18. In some such embodiments a temperature measurement and control circuit, also powered by the optical power converter, is included along with the cooler in order to keep the laser temperature constant.

The signal fiber pigtail 16 transports a large fraction of the light generated and modulated by the signal laser diode to its end, which is normally connected to a fiber cable 4. The signal fiber pigtail is coupled to the signal laser diode in a manner which allows a large fraction of light from the signal laser diode to be transported away from the photonic RF field probe head. In some embodiments, the fiber is cleaved and/or polished and positioned, using, for example, multi-axis optical translation and tilt stages to move it, and small glass block fixtures. Cement (e.g., UV-cured cement or epoxy) is used to hold it in place, so that its axis is very nearly perpendicular to the emitting surface of the signal laser diode and very close to it with its core 60 (FIG. 9) very nearly centered on the center of the signal laser diodes.

To achieve coupling between the signal fiber pigtail and the signal laser diode, the RF probe head assembly 8, less the signal fiber pigtail 16, the power fiber pigtail 20, and dielectric blocks 44 and 46 is preferably temporarily attached to a gimbal mount (using, for example, DUCO® brand adhesive, which can later be dissolved using acetone), with the signal laser diode near the gimbal point, which is placed upon a fine-resolution x,y,z translation stage. The signal fiber pigtail 16 is held near its final position independently of the RF probe head assembly. The optical power converter 18 is illuminated using a separate fiber on a separate adjustable mount in a manner which does not interfere with the signal fiber pigtail alignment process (e.g., from the side and at a slight angle). The gimbal and translation stages are then adjusted for maximum signal from the signal laser diode into the signal fiber pigtail. At this point, dielectric block 44 is placed upon supporting apparatus 24, in a manner which does not disturb the alignment, with small amount of UV-cured cement or epoxy between the block and the supporting apparatus. After positioning, a small amount of cement is then put between the block and the signal fiber pigtail. If the alignment is disturbed, block 44 is moved out of contact with the fiber, the cement is removed, and the procedure is repeated. As a final step, the cement is cured.

In alternative embodiments using VCSELs, the VCSEL die is attached directly to the end of the signal fiber pigtail prior to mounting both on the supporting apparatus and making electrical connections to the antenna and optical power converter. The VCSEL's output mirror is designed and fabricated so that VCSEL operation is optimum when the mirror is in contact with a material of index of refraction approximately that of quartz and of UV-cured cement or optical epoxy (about 1.5). In this method the signal fiber pigtail is cleaved or polished so that its end is very nearly perpendicular to its axis. Short metallic wires are connected to the VCSEL die's bonding pads. The fiber is then held in fixed position while VCSEL substrate 12 (FIG. 9) is temporarily held from the back side using for example, a vacuum-type chip manipulator (e.g., Techni-Tool part number 758M1014), and positioned using an x,y,z translation stage. Such a manipulator can later release the substrate without perturbing its positioning by releasing the vacuum. A small bead of UV-cured cement or optical epoxy is placed upon the end of the fiber. A power supply is temporarily connected to the VCSEL wires using, for example, long, thin metallic wires and small amounts of silver paint. The power supply is turned on and adjusted so that the VCSEL is generating appreciable light. Light exiting the far end of the fiber is monitored using a photodetector. The translation stage is then adjusted until maximum light is observed by the photodetector. At this point the cement is cured. The VCSEL and fiber assembly can then be mounted on the probe head assembly using, for example, dielectric blocks 36 and 44 and cement as in the fiber-coupling method described above. The temporary electrical connections are removed (e.g., by dissolution using acetone where silver paint was used). Permanent electrical connections to antenna 10 and optical power converter 18 are then made using, for example, conductive epoxy. The invention is not limited to these methods of fiber coupling. In other embodiments, for example, fiber coupling is aided by a lens (e.g., a GRIN lens) or lensed fibers (e.g., WCP-15LT-511-10C-STD from Wave Optics of Mountain View, Calif.) mounted using dielectric fixtures including, for example, silicon V-groove fiber mounts (also avail able from Wave Optics) between the VCSEL and signal fiber pigtail and aligned using similar temporary attachments to manipulation stages. The signal fiber pigtail may consist of either single mode or multimode fiber.

The signal fiber pigtail (and power Fiber pigtail 20 following its alignment described below) are preferably also cemented to supporting apparatus 24 at the end opposite the antenna. These fibers preferably include connectors at the end opposite the probe head for the purpose connecting it to fiber cable 4 or photodetector/power-laser unit 6.

The optical power converter 18 (which may be a PPC-12V manufactured by Photonic Power Systems of Mountain View, Calif.) converts light from the power fiber pigtail 20 into DC electric power present at a set of output terminals to be applied through the DC electrical network 22 (in the preferred embodiment) as a bias current input to the signal laser diode. In many embodiments the optical power converter consists of multiple, individual optical power converters, each of which provides a small voltage and which are connected in series, and electrical output terminals, or taps, are provided at various junctions between adjacent individual optical power converters so as to provide multiple voltages where needed (as can be provided in products by Photonic Power Systems). The optical power converter is preferably in unpackaged chip form (for example the Photonic Power Systems PPC-12V), or else is built into an integrated optical and electrical circuit also including the signal laser diode and the DC electrical network. The optical power converter is preferably as small as possible and as efficient as possible in converting light from the power fiber pigtail into electrical power. It must generate sufficient electrical voltage, current, and power to allow proper operation of all parts of the photonic RF field probe head. The optical power converter preferably has a large range, including the range needed RF-field probe operation, over which the output electrical power is very nearly linearly dependent upon the input optical power.

Power fiber pigtail 20, preferably a multi-mode fiber, brings light from a remote light source to the vicinity of optical power converter 18. Its output end is prepared (e.g., by cleaving and/or polishing) and positioned so as to illuminate the active parts of the optical power converter as uniformly as possible. After signal fiber pigtail 16 has been coupled to signal laser diode 14 and mounted on supporting apparatus 24, a multiaxis positioning system (for example the gimbal and x,y,z translation stage on which probe head assembly 8 is already attached if the first procedure for fiber coupling the signal fiber pigtail described above is used) is then used to position the optical power converter relative to the power fiber pigtail, held independently, for optimum illumination, as determined by maximum light output from the signal laser diode. After optimum illumination has been achieved, dielectric block 46 is positioned and attached to the power fiber pigtail and the supporting apparatus using cement in a manner similar to that described above for dielectric block 44. This invention is not limited to this manner of coupling the power fiber pigtail to the optical power converter. Other embodiments used for example, utilize silicon V-groove fiber mounts or lensed fibers (both avail able from Wave Optics of Mountain View, Calif.).

DC electrical network 22 preferably consists of a passive electrical circuit, having a pair of input terminals and a pair of output terminals, designed and fabricated by standard means to convert the DC electric power provided by the optical power converter 18 into a bias current for the signal laser diode. The DC electrical network also provides isolation of the optical power converter from RF voltages, preventing RF electrical loading by the optical power converter from significantly affecting the RF operation of the probe. In the preferred embodiment the DC electrical network consists of a pair of chip resistors 38 and 39 (having, for example, values of approximately 2 k$\Omega$ each) in series with the optical power converter and the signal laser diode. In other embodiments these resistors consist of thin, narrow strips of resistive material deposited on a surface, for example a surface of supporting apparatus 24. These resistors preferably have a low temperature coefficient. This invention is not limited to DC electrical networks of this type. In other embodiments, the DC electrical network consists, for example, of a single series resistor or of one or more series inductors, or other biasing network. Note that because resistors 38 and 39 are not large compared with the signal laser diode resistance, which varies with temperature, the combination of the optical power converter and the DC electrical network is neither a constant current source nor a power regulator. In embodiments which include an amplifier in RF electrical network 11, bias for signal laser diode 14 is preferably applied through the amplifier instead of using the DC electrical network, in which case DC electrical network 22 is not included. In other embodiments the amplifier is AC coupled and the DC electrical network is used as described to bias the signal laser diode.

Supporting apparatus 24 provides mechanical support of the other parts in a proper position and orientation with respect to each other. It is preferably small, thin, rigid, and wholly or primarily dielectric and includes fastening mechanisms for attaching the other parts. In the preferred embodiment, the supporting apparatus consists of a thin glass plate or other dielectric, such as GaAs, with small amounts of cement (e.g., UV-cured cement or epoxy) attaching all parts. In the other embodiments, all parts except the optical fibers are fabricated on a single, small gallium arsenide (GaAs) substrate using standard integrated circuit design and fabrication techniques. In either case, small glass or other dielectric block 44 is preferably used as described above to hold signal fiber pigtail 16 in the correct position with respect to signal laser diode 14, which is supported using other such block 36. Block 36 also supports antenna 10. A separate block 46 is used to hold power fiber pigtail 20 in the correct position with respect to optical power converter 18, which is supported in correct position using a block 50. Supporting blocks 36 and 50 may be small commercially-available diamond heat sinks, to better distribute heat produced within the signal laser diode or optical power converter. Supporting apparatus may also include, for example, other separate fixtures, such as small glass, GaAs, or diamond blocks, strips, or plates as needed to hold the various parts in optimum configurations with respect to other parts. In the preferred and other embodiments, such fixtures are preferably bonded to the parts they are helping position and to the rest of the supporting apparatus using cement (e.g., UV-cured or epoxy).

The supporting apparatus may include a protective cover or enclosure, made of dielectric material, preferably having a minimum amount of material and as small a dielectric constant as possible while still providing useful protection. The protective enclosure may be made of plastic foam, or a thin spherical dielectric shell (e.g., a ping-pong ball) covering the antenna and signal laser diode end of probe head assembly 8, with a hole in the cover provided for entry of the probe head assembly, positioned so that the antenna is centered approximately at the center of the sphere. The remainder of the probe head assembly may then be contained in a thin-walled dielectric (e.g., plastic) tube, cemented to the spherical shell. The supporting apparatus may also include a preferably-small-diameter dielectric (e.g., plastic) jacket for protection of the signal fiber pigtail 16 and power fiber pigtail 20. Preferably a single jacket is provided for both fibers and the jacket is attached to the supporting apparatus or to the tube containing that apparatus, if provide, using a rubber boot and/or cement (e.g., silicone gel cement).

The multiple electrical connections 26 consist of electrical conductors or partial conductors, fabricated by standard means of standard electrically-conductive or partially-electrically-conductive materials, for the purpose of transporting electrical signals (voltages and currents) between the terminals of the other parts. The multiple electrical connections preferably connect the output terminals of the antenna to the input terminals of the signal laser diode, the output terminals of the optical power converter to the input terminals of the DC electrical network, and the output terminals of the DC electrical network to the input terminals of the signal laser diode. In the preferred embodiment the multiple electrical connections consist of thin, short gold wires 52 attached using electrically-conducting cement (e.g., electrically-conducting epoxy). These wires are preferably as short as possible and are arranged to lie with their lengths primarily perpendicular to the axis of antenna 10. This invention is not limited to multiple electrical connections as described above. In other embodiments, for example, the multiple electrical connections consist of thin metal strips, deposited on a surface of the supporting apparatus using, in some embodiments, standard evaporation techniques with masks made by standard photolithography techniques. Connections to these thin metal strips are made using standard wire-bond techniques or by using small amounts of electrically-conducting cement (e.g., electrically-conducting epoxy). The electrical connections may also be made using individual wires, with connections made to the input and output terminals on the other parts using standard wire-bond techniques.

Figure 10:
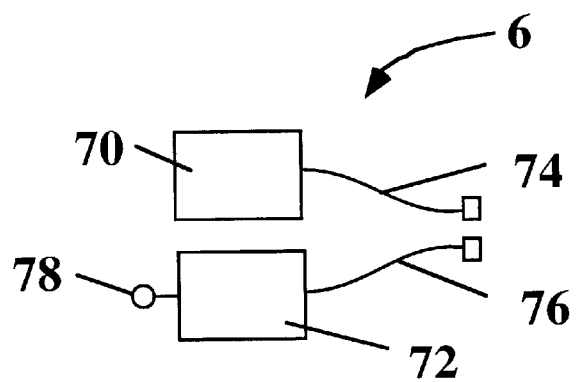
FIG. 10 is a block diagram of a receiver/power-laser unit of the invention.

Referring now to FIG. 10, the receiver/power-laser unit 6 comprises power laser unit 70 and a photodetector unit 72. Power laser unit 70 comprises a power laser and a power-laser power supply and control unit. The power laser is preferably an inexpensive, fiber-coupled, multi-mode laser capable of providing sufficient power into multi-mode output fiber 74. Output fiber 74 is connected to power fiber pigtail 20 in the probe head via fiber cable 4 to power probe head 2. Output fiber 74 preferably has connectors for connecting to a suitable fiber contained in fiber cable 4 or directly to signal fiber pigtail 16 in the probe head. The power unit further comprises a means of varying the optical power in its output fiber as well as means of monitoring this power, and of, when desired, keeping it very nearly constant, using standard means (consisting of a variable current source, a photodetector, a means for coupling a constant fraction of the light in the output fiber into the photodetector, and power-regulating, feedback electronics for varying the current output of the current source). Preferred means of varying the optical power comprise a calibrated voltage input. Preferred means of monitoring this power comprise a calibrated voltage output.

Photodetector unit 72 comprises a photodetector and, in the preferred embodiment, an RF amplifier which amplifies the output of the photodetector. The photodetector is coupled to input fiber 76 connected to signal fiber pigtail 16 via fiber cable 4. Input fiber 76 preferably has connectors for connecting to a suitable fiber contained in fiber cable 4. The photodetector unit converts optical modulations transmitted by probe head 2 into RF electrical signals present at RF output 78. Photodetector unit preferably also includes a separate output proportional to the time averaged (DC) optical power into the photodetector (a DC monitor), which, preferably, consists of a calibrated voltage output.

Fiber cable 4 (where provided) preferably consists of two fibers, one similar to power fiber pigtail 20 and power laser output fiber 74 and one similar to signal fiber pigtail 16 and photodetector input fiber 76, both having connectors at each end for connecting to these fibers and, preferably, contained within a protective, preferably plastic, jacket.

The temperature of the receiver/power-laser unit is kept within narrow limits during operation by operating it, for example, in a temperature controlled environment, or else by using coolers or heaters of standard design together with temperature control loops to keep at least the most temperature sensitive parts at very-nearly constant temperature. The receiver/power-laser unit is also preferably housed in an electromagnetically shielded enclosure.

Operation of the preferred embodiment of the RF-field probe is described as follows: RF-field probe head 2 is immersed in an RF field desired to be detected and/or measured, and receiver/power-laser unit 6 is placed in a convenient remote location out of the RF fields, with fiber cable 4 stretching in between (FIG. 1). When power laser unit 70 (FIG. 7) and photodetector unit 72 are turned on, the power laser unit sends optical power through output fiber 74, then through a fiber contained in the fiber cable, and finally through power fiber pigtail 20 to optical power converter 18 in the probe head (FIGS. 2–5). These fibers are connected to each other using fiber connectors, as are signal fiber pigtail 16, a second fiber in the fiber cable, and input fiber 76. The optical power converter converts the optical power into electrical power. DC electrical network 22, consisting of series resistors 38 and 39 in the preferred embodiment, passes electrical bias current to probe head laser 14 (VCSEL or other semiconductor laser in the preferred embodiment), while isolating antenna 10 from appreciable loading by the optical power converter. The antenna converts the RF field into RF electrical current, and the probe head laser converts this RF electrical current into an RF-frequency optical modulation. Signal fiber pigtail 16 transports this optical modulation, together with continuous-wave light due to the bias current into a fiber in the fiber cable and into input fiber 76 in the photodetector/power-laser unit. A photodetector and, in the preferred embodiment, an amplifier in photodetector unit 72 convert the optical modulation into an RF electrical signal of sufficient magnitude to be usable by common RF measurement apparatus (such as an RF detector, a spectrum analyzer, or a network analyzer). Similar operation is employed for detecting or measuring broadband fields, having many RF-field components except that other measurement apparatus (such as a wideband digitizer or sampling oscilloscope) are typically used instead. For high accuracy, measurements of known RF fields are made periodically under similar environmental conditions to provide probe calibration data. Methods of determining changes in probe sensitivity due to fluctuations in probe head laser temperature and perturbations of the fibers are described below.

Figure 11:
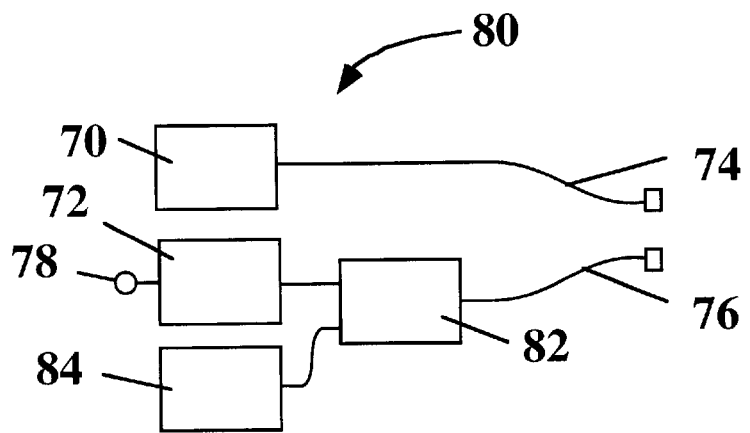
FIG. 11 is a block diagram of a receiver/laser unit for a reflective multiple quantum well (RMQWM) RF-field probe embodiment.

In an alternative embodiment, signal laser diode 14 is replaced by a reflective multiple quantum well modulator (RMQWM). The high capacitive impedance of the RMQWM matches the impedance of many small (e.g., dipole) antennas well and allows good frequency response to very low frequencies. An RMQWM a device, geometrically similar to a VCSEL, modulates light incident normally on its surface in response to a voltage applied to its electrodes and reflects it back, also normally to its surface. In most such embodiments the other probe head parts shown in FIGS. 2–5 as described above are present. In such an embodiment, receiver/power-laser unit 6 is replaced by receiver/laser unit 80 which includes 2X1 fiber splitter or optical circulator 82 and separate fiber-coupled signal laser 84 (FIG. 11). Light from the signal laser, which is preferably low-noise, stable, tunable, isolated, and a wavelength coincident with the operating wavelength range of the RMQWM (preferably a semiconductor laser), is transmitted to the RMQWM via fiber cable 4 and signal fiber pigtail 16. The RMQWM modulates the light in response to RF signals from the antenna. Optical power converter 18 provides the bias voltage. Because the RMQWM draws negligible DC current, the RF electrical network includes a parallel resistor so that the bias voltage can be varied by varying the optical power from power laser 70. Either the light from the power laser or the signal laser frequency is dithered at a low frequency (well below any RF frequency of interest) and the resulting modulated light returning from the probe head monitored as a means of determining the operating point sensitivity of the probe. In some embodiments standard means of detecting this low-frequency modulation and a Feedback loop of standard design are used to maintain the bias voltage and signal laser frequency at optimum values.

The operation of probe embodiments comprising a reflective multiple quantum well modulator (RMQWM) instead of a VCSEL or other laser are similar. The primary exception is that, because such a modulator does not generate light, a separate signal laser 84 and fiber splitter or optical circulator 82 are required. Light from the signal laser is sent through the splitter or circulator out to the RMQWM in the probe head, reflected back with modulation proportional to the RF fields at the probe head superposed on the light, and passed on to the photodetector unit by the splitter or optical circulator. If a 2X1 fiber splitter is used, half of the light is lost going each way, and the laser must have an optical isolator to prevent unstable performance due to light being reflected back into it. An optical circulator, on the other hand, separates the light traveling in one direction from the light traveling in the other direction with relatively little loss. The RMQWM modulates light by varying the reflectivity as a function of the applied RF voltage from the antenna (using electroabsorption occurring within the quantum wells). The laser wavelength and bias voltage is adjusted to points at which the variation of reflectivity per unit variation in applied voltage is high.

Calibration

Figure 12:
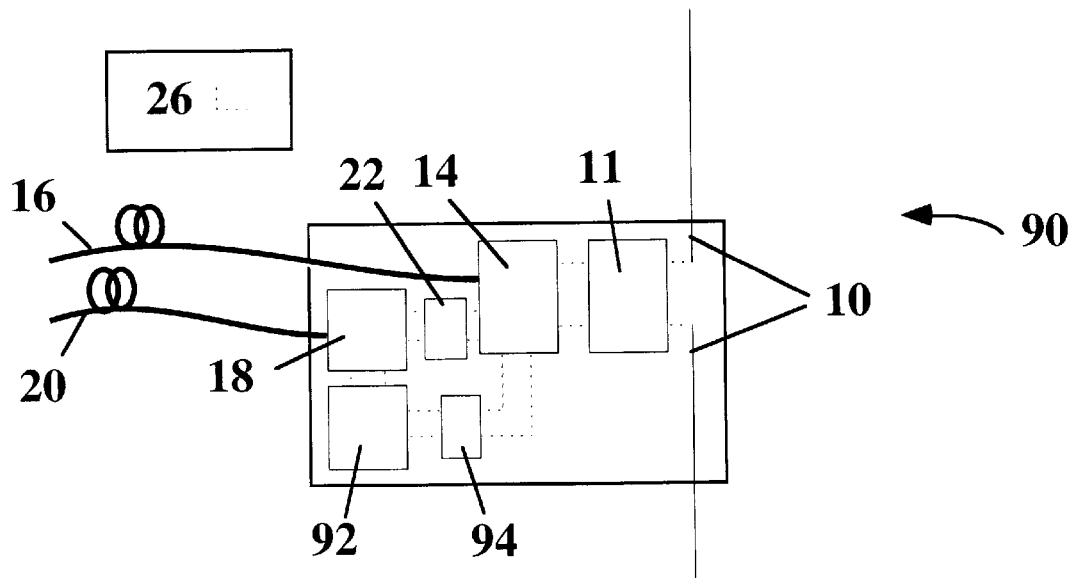
FIG. 12 is a block diagram of an embodiment of the RF-field probe head incorporating a calibration oscillator.
Figure 13:
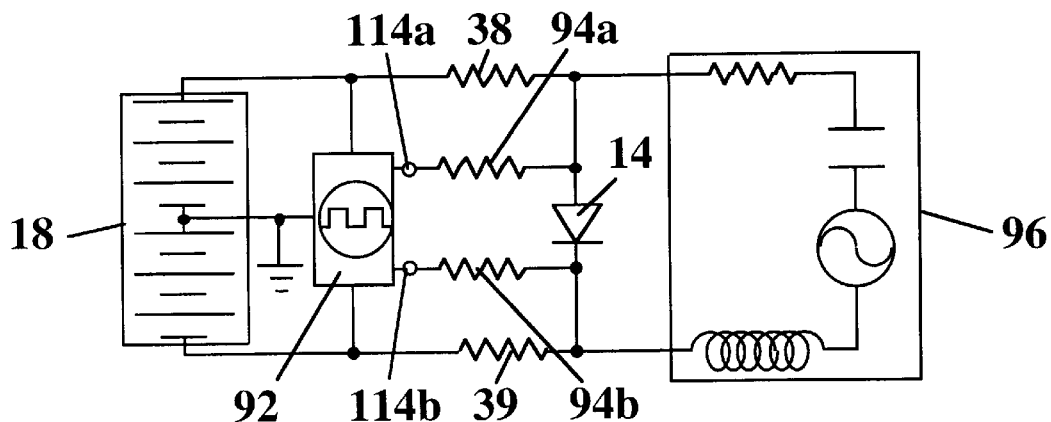
FIG. 13 is a circuit diagram of an embodiment of an RF-field probe head incorporating a reference oscillator circuit.

The sensitivity of the photonic RF-field probe typically varies with temperature and with variations in optical loss, which can occur, for example, when the fiber is bent. A low-frequency reference oscillator circuit 92, which generates a signal with very nearly constant voltage amplitude for calibration purposes, may desirably be included in the probe head assembly 90 (FIGS. 12 and 13). The reference oscillator circuit preferably operates at a frequency below that of any RF fields for which probing is desired. It is preferably as small as possible, consisting of a small number of chips or dies, and consumes as little power as possible. It is powered by the same optical power converter 18 that biases the signal laser diode or RMQWM, and connects to the input terminals of the signal laser diode or RMQWM via AC electrical network 94. This network preferably consists of two (e.g., 51 kΩ) resistors 94a and 94b, each in series with an output terminal of the reference oscillator circuit and an input terminal of the laser or modulator, as shown. Such an arrangement partially simulates antenna circuit 96, which consists of a voltage oscillator proportional to the RF field being detected with a large series impedance at low frequencies. Resistors 94a and 94b are preferably minimal-size chip resistors. Alternatively, thin, narrow strips of resistive material (e.g., nichrome) deposited on a dielectric surface such as that of the supporting apparatus 24 are used. The use of such large resistors isolates optical power converter 18 and antenna 10 from the reference oscillator circuit (prevents them from being loaded by it), provides a very-nearly constant oscillating current into the signal laser diode, where provided, and limits the current drawn by the reference oscillator circuit (limits its load). The reference current signal into the signal diode laser is small compared with the DC current into the signal laser diode. In the cases where an RMQWM, which has a very high, capacitive impedance at low frequencies, is provided instead of a signal diode laser, the resistors may be replaced by very small chip capacitors.

Figure 14:
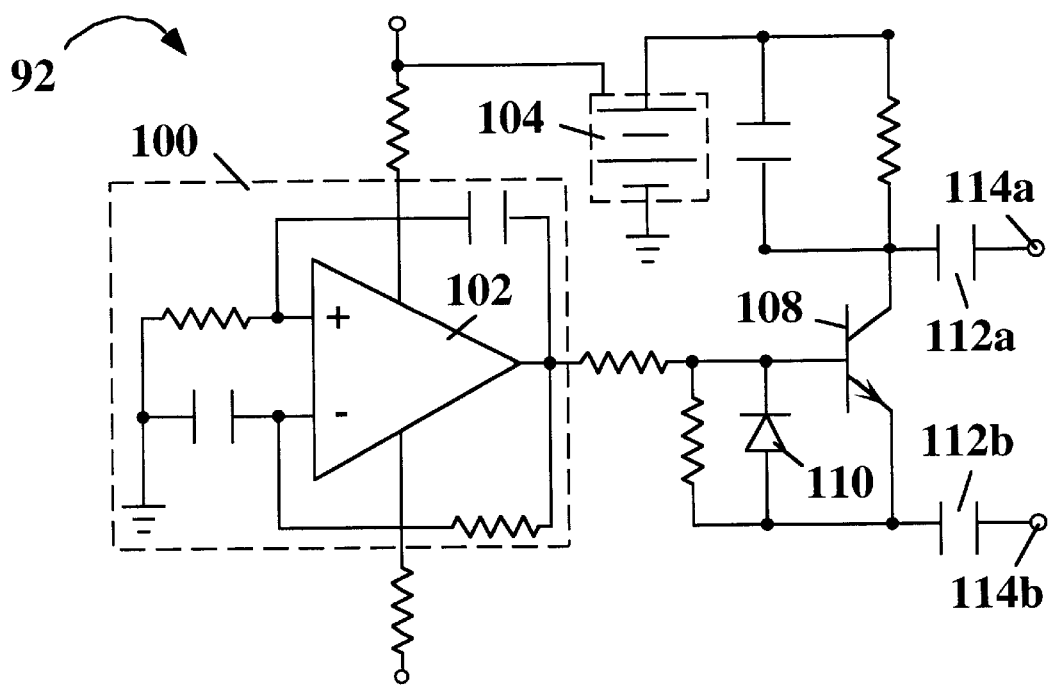
FIG. 14 is a reference diagram of a reference oscillator.

As illustrated in FIG. 14, the reference oscillator circuit is preferably based upon a standard operational amplifier relaxation oscillator circuit 100, achieving very-nearlyconstant voltage amplitude between AC-coupled outputs 114a and 114b by driving bipolar transistor 108 into saturation against voltage reference 104. Power is supplied from three taps (+, −, and ground) on optical power converter 18 (for example a Photonic Power Systems PPC-12V). This relaxation oscillator circuit preferably uses a chip CMOS operational amplifier 102, such as the Texas Instruments TLC2272Y, and chip versions of transistor 108 (e.g., a 2N222), diode 110 (e.g., a 1N4148), and all passive components. Such a circuit provides better than 1% voltage amplitude stability over a temperature range of −20 to +60 degrees C., in the presence of a appreciable (e.g., −22 mV per degree C.) voltage temperature coefficient of the optical power converter.

This invention is not limited to the reference oscillator circuit of FIG. 14, but may incorporate any small, preferably single or multiple chip or die oscillator circuit of approximately constant amplitude which can be powered by am optical power converter. Other examples include circuits using common standard temperature compensation techniques (e.g., using miniature thermistors), based, for example, upon the chip-form timer circuit, the TLC555Y or a chip-form crystal oscillators utilizing, for example, the HA7210Y and the Statek CX-4V-SM crystal. In some embodiments having an approximately square-wave output (such as that of FIG. 14), the output is low-pass filtered to provide an approximately sinusoidal output, to allow detection at the other end using common AC-detection techniques. The oscillator is also not limited to low frequency oscillation. Some embodiments comprising RF amplifiers between the antenna and signal laser diode or RMQWM also incorporate a reference oscillator circuit. In such embodiments comprising a reference oscillator having frequency below the lower cut-off frequency of the RF amplifier, the oscillator is connected as before to the laser or modulator. In this case the AC electrical network (e.g., large series resistors or small series capacitors) isolates the RF amplifier from being loaded by the oscillator circuit. Proper thermal design is preferably used to minimize the effects of temperature on the performance of the amplifier. In embodiments comprising an amplifier having a lower cut-off frequency below the frequency of the comprised reference oscillator, the oscillator is connected to the amplifier input through the AC electrical network which isolates the antenna from the oscillator circuit. Still smaller versions of the reference oscillator circuit are realized by designing and fabricating a single custom chip containing all required components for such an oscillator circuit.

In operation, the reference oscillator circuit provides an electrical modulation of the signal laser diode (or RMQWM), resulting in a nearly proportional modulation of the optical output, resulting in a nearly-proportional reference oscillatory electrical output signal from the photodetector in photodetector unit 72. As the temperature of the probe head or else the optical losses change, the reference output changes in a similar manner to the change in probe signal due to a fixed RF-field at the RF-field probe head. This similarity is especially strong for RF fields having frequency not very different from that of the reference oscillator. Thus, the reference oscillatory signal from the photodetector is used for calibration purposes. In probe systems where the photodetector amplifier has sufficient low-frequency response to pass the reference signal, or in cases where no such amplifier is provided, the same instrumentation used for observing and measuring the RF-field signals, for example, is similarly used to periodically monitor the reference signal, and the data is corrected according to the extent to which it is observed to change. In some embodiments, this process is automated using a computer with a computer-interfaced analog-to-digital converter to acquire the reference signal and software to measure and maintain a computer record of changes in this signal and, in some cases, to apply corrections to the data. In other embodiments dedicated digital circuitry or a dedicated microprocessor, in either case contained within the photodetector/power-laser unit, are used instead of a computer.

The response of the photodetector amplifier may be limited to frequencies higher than the reference oscillator signal (e.g., a 100-MHz low-frequency cut-off amplifier and a 100-kHz reference signal oscillator signal). In this case, the reference signal out of the photodetector is monitored between the photodetector and the amplifier (using, for example, a directional coupler, diplexer, or bias tee) or else by monitoring the photodetector bias current (in which case the photodetector bias circuit must be designed to have sufficient frequency response). In many embodiments, bandpass filtering, a separate, low-frequency amplifier, and a dedicated low-frequency AC detection circuit (e.g., a standard operational amplifier-based active rectifier with a standard averaging circuit) are used to convert the oscillatory reference signal into a DC reference signal. This signal is used as an indicator of changes in probe calibration during probe operation.

The photodetector amplifier may also be a voltage-variable-gain amplifier (e.g., an amplifier of the Miteq AVG series), and in this case the DC reference signal is used, after proper conditioning, to correct the variable amplifier gain, thus maintaining approximately constant probe sensitivity (using standard control loop techniques, such as low-pass filtering, to provide stable correction). Alternatively, a voltage-variable attenuator is placed at the output of the probe photodetector unit, and the value of the attenuation is adjusted by feedback so as to maintain very-nearly-constant probe sensitivity. In some embodiments, such a correction is determined and applied by computer automation using a computer with computer-interfaced analog-to-digital converter to acquire the reference signal (either rectified or not) and a computer-interfaced digital-to-analog converter to apply the correction signal to the variable gain amplifier or variable attenuator. In other embodiments dedicated analog and digital circuitry, in some cases including a dedicated microprocessor, in either case contained within the photodetector/power-laser unit, are used instead of a computer.

In some cases very accurate calibration is required, but probe head size or power consumption limitations preclude the incorporation of a reference oscillator circuit in the probe head. In addition, in cases where the probe must have exceptional broadband response, the low frequency reference signal is of limited use due to variations in the signal laser diode (where provided) frequency response with temperature. In such embodiments the optical output of the power laser unit 70 is varied while monitoring the output of the photodetector in photodetector unit 72 as a means of calibrating the probe. This calibration can be used to determine the approximate probe calibration in the presence of temperature changes and fiber attenuation changes in the preferred embodiment and most other embodiments without modification. It further allows approximate determination of the signal laser diode temperature and, in many embodiments, the approximate temperature of the environment of the probe head. This method is performed as follows.

For a typical signal laser diode (e.g., a VCSEL), the ratio of the DC input power at threshold to that at a fixed optical output power depends sensitively upon temperature. Values of this ratio for a particular VCSEL vs. temperature are given in Table 1, which indicates a variation of this ratio of approximately 1.6% per degree C. around room temperature. Thus, measurement of this ratio allows an approximate determination of the laser temperature. Moreover, because ratios of power are involved, this method is partially compensated for variations in the attenuation of the optical path from the power laser unit to optical power converter 18 and for the dependence of the optical power converter on temperature, provided the two measurements are both obtained at approximately the same temperature. Furthermore, if the attenuation in the optical path from the signal laser diode to the photodetector unit increases (decreases), this method would indicate a temperature which is too high (too low) and thus a laser sensitivity or slope efficiency which is too low (too high), since the variation of optical output power with input current decreases with temperature. However, the variation of power detected at the photodetector is reduced (increased) with increased (reduced) optical attenuation, thus partially compensating for the overestimation (underestimation) of the laser temperature. Highest accuracy is obtained using an optical power converter for which output electrical power is an approximately linear function of optical input power over the range used, which is preferred.

TABLE 1

| Temperature (degrees C.) | Sample ratio of DC input power at threshold to DC input power at fixed optical output power |
|---|---|
| −50 | 2.11 |
| 25 | 5.77 |
| 100 | 9.8 |

If the signal laser diode is in intimate thermal contact with the environment, this method further gives a measure of the ambient temperature at the position of the probe head. Such intimate contact is readily realized by placing the signal laser diode in intimate contact with the metallic, and thermally conductive, antenna 10. If a thermally insulating protective cover is used, thermal contact between the antenna and the environment can be made by attaching the end of the antenna to the cover and, if necessary, allowing some metal to protrude through a hole in the cover.

One such method of determining signal laser diode calibration and temperature is as follows: The optical power in the power laser unit output fiber is varied and monitored (using standard means provided). This is accomplished, for example, using a calibrated power supply to input voltage to the calibrated output-power-variation voltage input on the power laser unit. At the same time the DC photodetector output is monitored using, for example, the calibrated voltage output provided for this purpose on photodetector unit 72 together with a voltmeter. These are then used in a probe calibration procedure with the RF-field probe head in a temperature-controlled environment to obtain extensive curves of, for example, the ratio of optical power in the power laser unit output fiber at the signal laser diode threshold (the point at which a measurable DC photodetector output is first observed) to the optical power in the power laser unit output fiber at a fixed, convenient operating point (e.g., the point of maximum probe sensitivity for typical RF fields of interest) for many different temperatures over the operating temperature range of the probe.

At each temperature, the probe is irradiated with known fields (using standard techniques) at various frequencies to also prepare tables and/or curves of probe sensitivity and frequency response vs. temperature. In this way calibration tables and/or curves of probe temperature, sensitivity, and frequency response vs. this ratio is prepared. Then, during probe use, this same ratio is periodically measured using, for example, the same apparatus and method, and the tables and/or curves are used to determine the signal laser diode temperature, sensitivity, and frequency response.

The present invention is not limited to this specific procedure; what is important is that measurements of optical power in the power laser unit output fiber are used with measurements of DC photodetector output to determine signal laser diode temperature, thus giving approximate RF-field probe sensitivity and frequency response. Other examples of application of this method include dithering (applying a small oscillation) to the power laser optical output and using the resulting oscillating photodetector electrical output to monitor and/or correct for variations, especially short-term variations, in probe sensitivity. Other variations include using measurements of optical power in the power laser unit output fiber and DC photodetector output in combination with signals from a reference oscillator in the probe head for calibration purposes. In other examples, such measurements of optical power in the power laser unit output fiber and DC photodetector output are made periodically and rapidly by computer automation using one or more computer-interfaced analog-to-digital converters to monitor such measurement signals. In these embodiments the computer maintains a record of such calibration data and, in some embodiments, uses this data to correct the RF-field data obtained by the probe. In other cases using a computer-interfaced digital-to-analog converter is further used to apply the correction signal to a variable gain amplifier or variable attenuator in the photodetector unit, thereby maintaining approximately constant probe sensitivity. In still further embodiments dedicated digital circuitry, in some cases including a dedicated microprocessor, in either case contained within the photodetector/power-laser unit, are used instead of a computer. In embodiments using computer automation or dedicated circuitry this method can be applied very rapidly during probe operation with minimal downtime (e.g., a few milliseconds).

Figure 15:
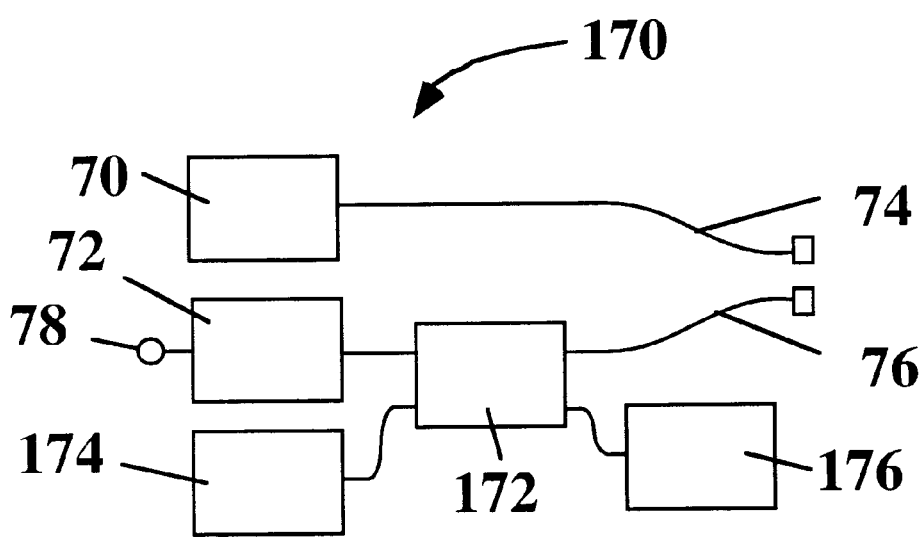
FIG. 15 is a block diagram of the receiver/power-laser unit incorporating a means for measuring the approximate attenuation of the signal fiber path.

Besides signal laser diode temperature, the probe sensitivity also depends upon losses in the optical path between the signal laser diode (where the probe head comprises a signal laser diode) and the photodetector unit. A design for approximately determining this attenuation is given in FIG. 15. Receiver/power-laser unit 6 is replaced by receiver/laser unit 170. Fiber-coupled light source 174, preferably an LED, fiber directional coupler 172, and fiber-coupled photodetector 176 are connected as shown to photodetector unit input fiber 76. The light source preferably comprises a means by which its output, launched in the fiber toward directional coupler 172, can be modulated in response to an electrical input. The wavelength of light source 174 is preferably higher than that of the signal laser diode and is preferably not at a resonance frequency of the laser cavity, but is preferably within the operating regime of the photodetector in photodetector unit 72. The fiber coupling and input surface of photodetector 176 are such that very little light is reflected back into the fiber from the photodetector (e.g., the fiber is angle polished and the photodetector is anti-reflective coated, or an optical isolator is used), and the directivity of the fiber directional coupler is chosen such that very little light from light source 174 is coupled into photodetector unit 72.

In operation, light source 174 is modulated the directional coupler diverts some of the resulting modulated light into photodetector input fiber 76, propagating toward the probe head, and photodetector 176 is used to monitor the amount of optical power coupled into fiber 76. The light source is modulated at a frequency different from that of any RF fields of interest and different from that of reference oscillator 92, if provided This is accomplished, for example, using a common sine-wave or square-wave generator to provide electrical input to produce the modulation of the light source and using an oscilloscope to monitor the electrical output of photodetector 176. The resulting modulated light propagates to the signal diode laser in the probe head, which reflects part of it back down the fiber path way to the photodetector unit. The optical output power of the light source and the coupling ratio of the fiber directional coupler are chosen such that this reflected power is small compared with light generated by the diode signal laser as measured at the photodetector unit. The output of the photodetector in photodetector unit 72 is also monitored, and the component which is modulated at the frequency at which light source 174 is modulated is measured (using, for example, band-pass filtering and a separate channel of the oscilloscope). In this way the ratio of the round-trip amount of light lost in traveling from fiber directional coupler 172 to the signal laser diode, reflecting from the diode, and returning to the photodetector unit to the light generated by light source 174 is approximately measured. Because the amount reflected by the laser is not strongly dependent upon temperature (for higher-wavelength, non-resonant light), variations in the round-trip amount of light lost (e.g., due to fiber bending) are quantitatively related to the amount of signal laser diode light lost in traveling to the photodetector unit. By bending or otherwise perturbing the fibers carrying the signal laser diode light while measuring the former amount of lost light (from the fiber directional coupler to the signal laser diode to the photodetector unit) as described and measuring the resulting change in probe sensitivity prior to using the probe, a table or curve relating these two quantities together is determined. Then, in probe operation, measurement of this amount of lost light (relative to the amount of light detected by photodetector 176) combined with such a table or curve are used to approximately determine the change in probe sensitivity due to perturbing the fibers carrying the signal laser diode light. This determination is then used to correct the probe data or to correct the sensitivity by adjusting for example, the gain of the photodetector amplifier in the photodetector unit.

The present invention is not limited to this method of determining and correcting the effect of fiber perturbations on probe sensitivity, which is only given as an example, but includes any method of injecting light from the photodetector unit end into the fibers carrying the signal laser diode light and measuring the amount of light returning to the photodetector unit. In other examples, such a measurement is made and applied by computer automation using a computer with computer-interfaced analog-to-digital converter to monitor both photodetector signals and to either maintain a record of such calibration information or to correct the RF-field data obtained or, using a computer-interfaced digital-to-analog converter, to apply the correction signal to a variable gain amplifier or variable attenuator in the photodetector unit. In some embodiments dedicated digital circuitry or a dedicated microprocessor, in either case contained within the photodetector/power-laser unit, are used instead of a computer. In some embodiments a dedicated sine-wave or square-wave generator is used to provide the modulation electrical input to light source 174. In some embodiment common phase sensitive (lock-in) detection techniques are used to sensitively monitor the photodiode signals at the frequency of modulation of light source 174.

Figure 16:
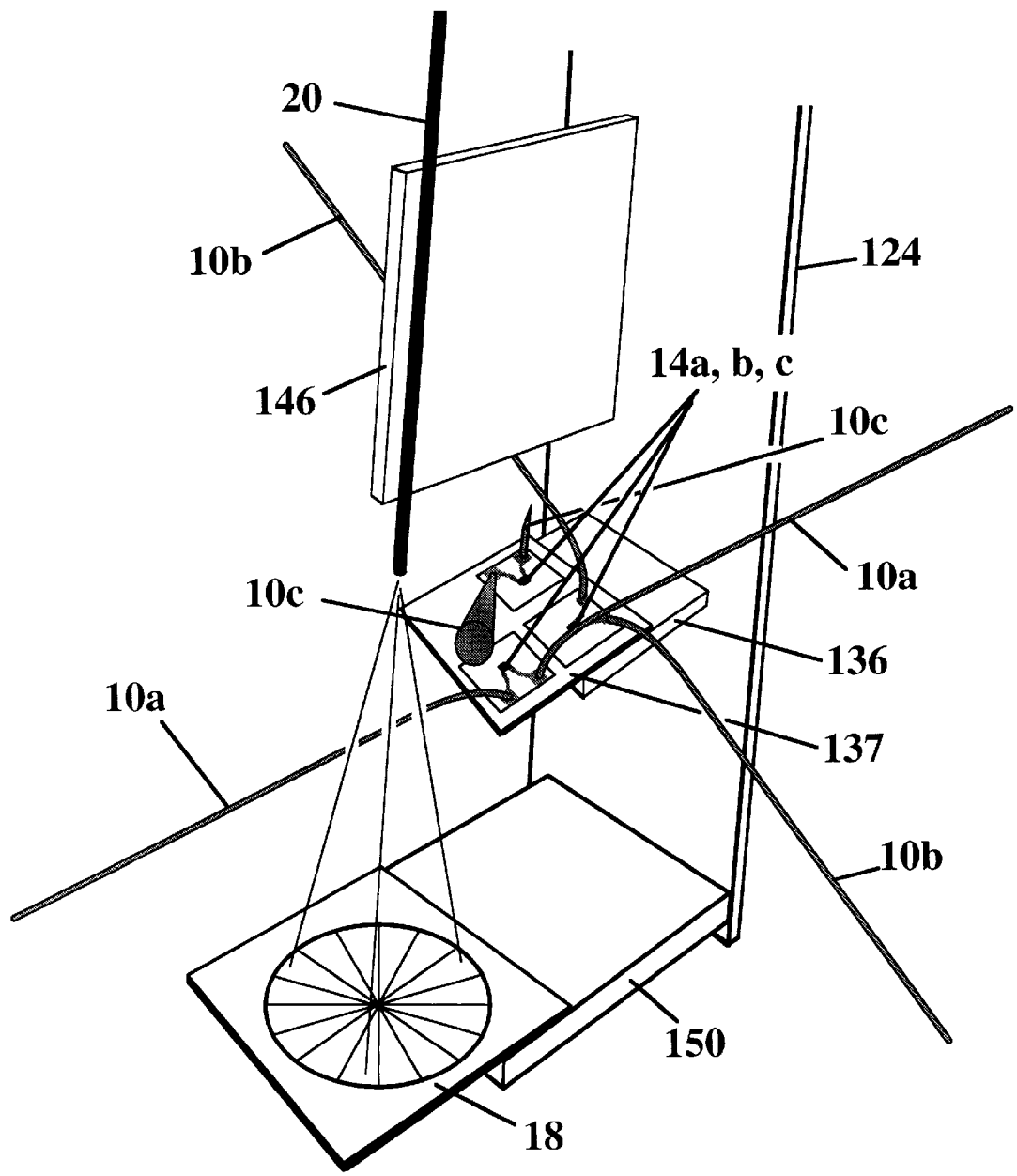
FIG. 16 is a partial perspective view of a three axis embodiment of the RF field probe head according to the invention.

In another embodiment, shown in FIG. 16, the RF-field probe head 2 embodies three antennas, three RF electrical networks, three signal laser diodes, other lasers, or RMQWMs, three signal fiber pigtails, three DC electrical networks, a single optical power converter providing all required DC electrical power and biases, a single power fiber pigtail, as well as multiple electrical connections as required for all parts to function properly. Supporting apparatus is provided to maintain the position and orientation of all parts. In this embodiment, the three antennas are arranged so as to provide electrical signals at their output terminals proportional to three mutually-perpendicular components of the radiated RF field. Thus, these alternative-embodiment photonic RF field probe heads provide optical amplitude modulations on three fibers, each of which is proportional to a different mutually-perpendicular component of the RF field. In such embodiments photodetector/power-laser unit 6 comprises three separate photodetector units, each having a separate output. Furthermore in such embodiments, fiber cable 4 (if provided) comprises four fibers, including the one for carrying light to the probe head from the power laser and three to carry light between the lasers in the probe head of the photodetectors. Three-axis embodiments using RMQWMs instead of lasers in the RF-field probe head, also comprise means located in the photodetector/power-laser unit for generating light and sending it to the probe via the same fibers used for carrying the light from the probe head to the photodetectors.

Figure 3:
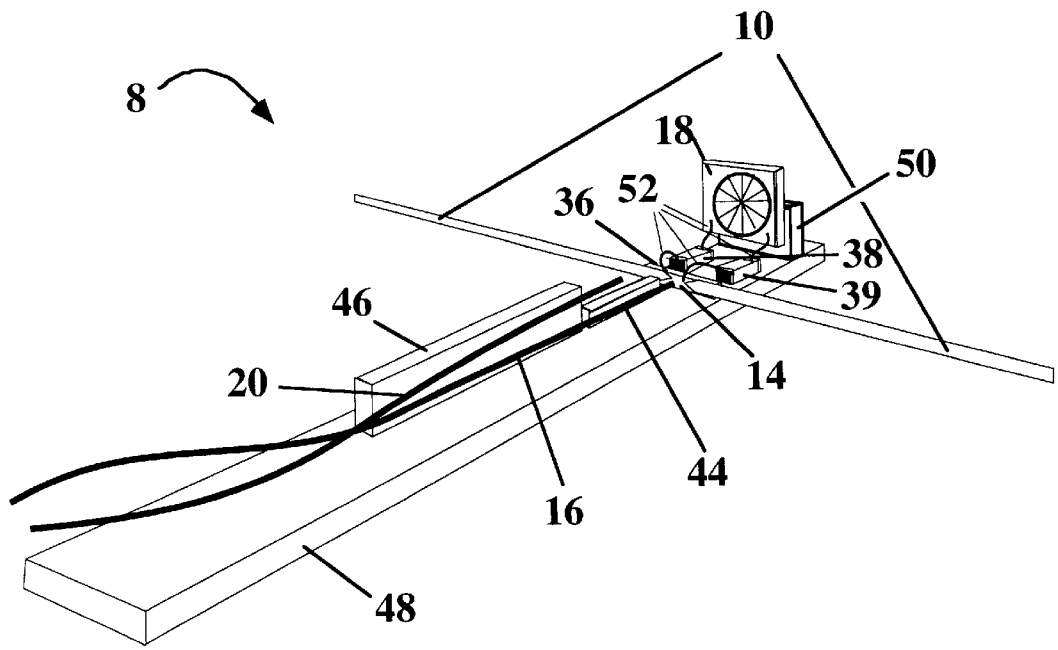
FIG. 3 is a perspective view of a preferred embodiment of the RF-field probe head.
Figure 4:
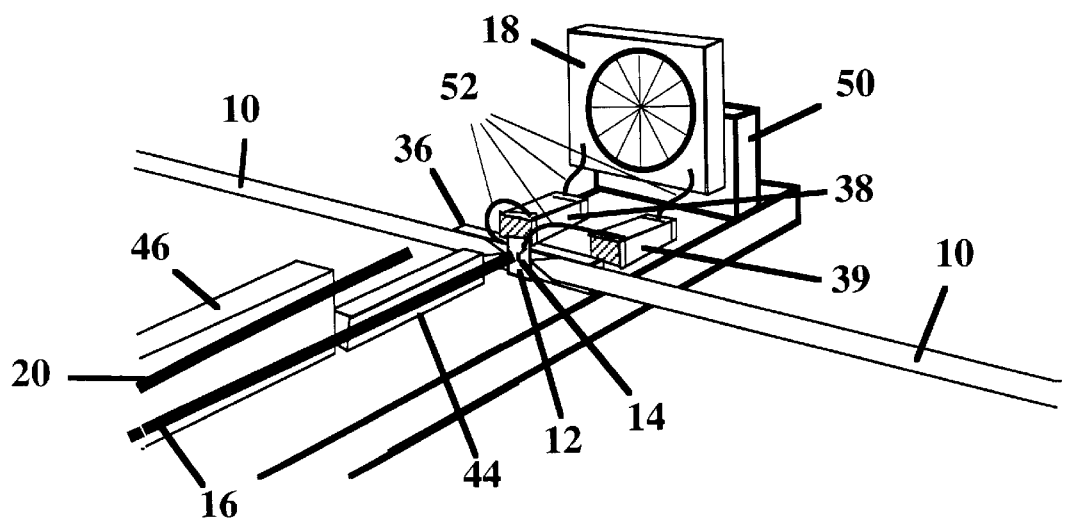
FIG. 4 is a perspective detail of a preferred embodiment of the RF-field probe head.
Figure 5:
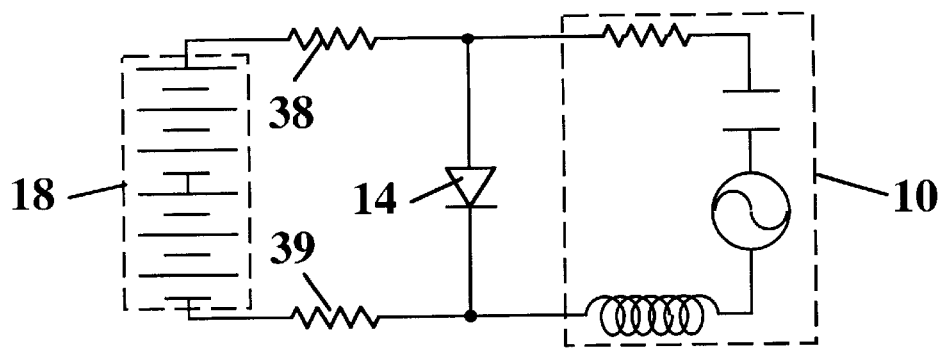
FIG. 5 is a circuit diagram of a preferred embodiment of the RF-field probe head.
Figure 17:
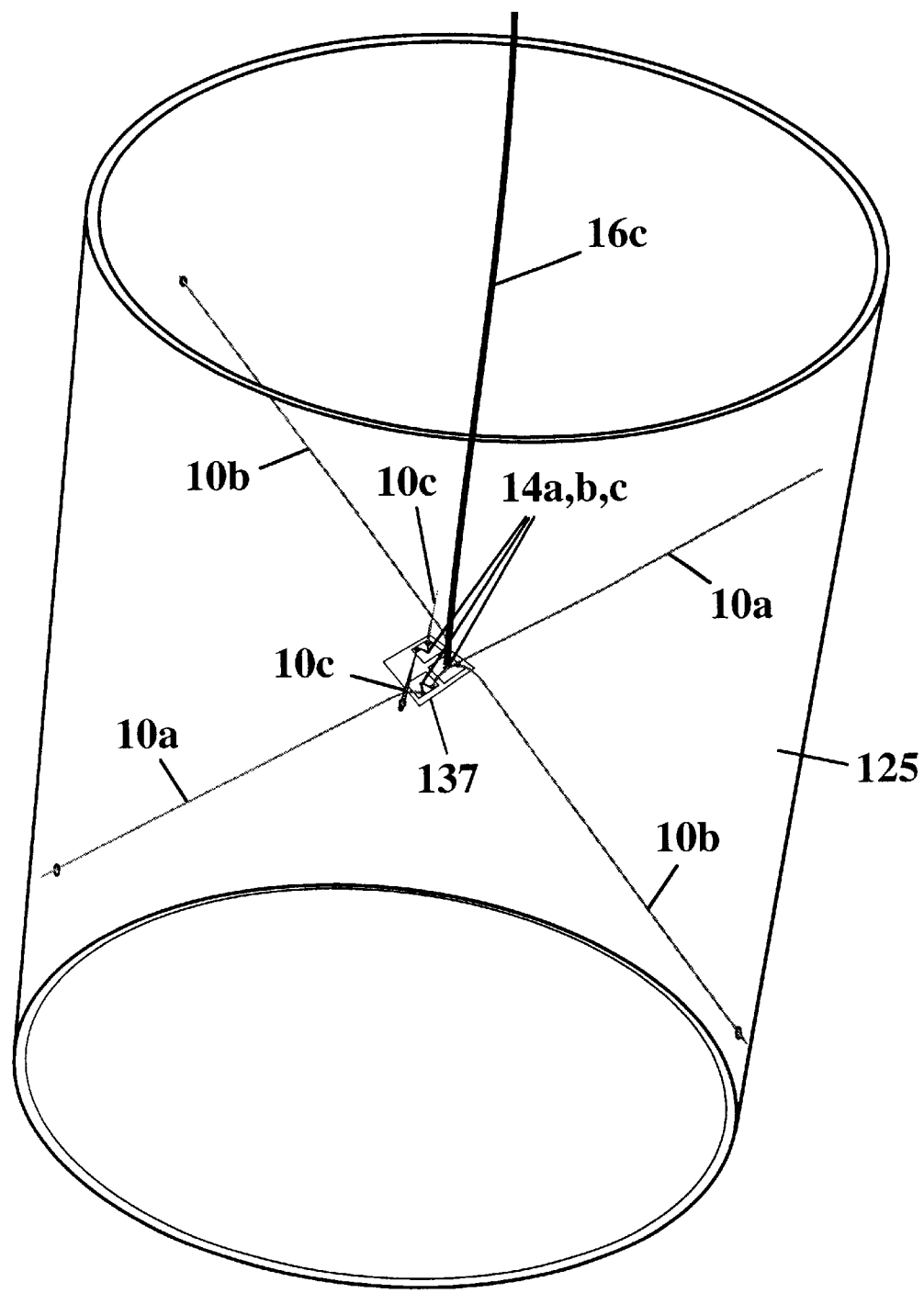
FIG. 17 is a partial perspective view of a method of supporting and enclosing a thrre-axis axis embodiment of the RF-field probe head.

The three-axis RF-field probe head embodiments (FIG. 16) may be similar in construction to that described above for the preferred single-axis RF-field probe head (FIGS. 3 and 4). The signal laser diodes are preferably VCSELs and are mounted on dielectric plate 137 (e.g., glass or GaAs), which is in turn mounted on dielectric block 136, which is cemented to support apparatus 124 (using, for example, UV-cured cement or epoxy). In this case the VCSELs are used and are preferably first aligned and cemented to the three separate signal fiber pigtails (not shown) prior to mounting as shown (as described as an alternate VCSEL-to-fiber alignment procedure above). While the signal fiber pigtails are left out of FIG. 16, signal fiber pigtail 16c is shown in FIG. 17, in which many of the probe head parts shown in FIG. 16 are not shown. An embodiment employing wire dipole antennas 10a, 10b, and 10c is shown. The antenna wires are bonded to the VCSELs' bonding pads after fiber coupling. In some embodiments the antenna wires are supported by thin-walled plastic tube 125 (FIG. 17), which also forms a protective probe head enclosure. The wires are threaded through small holes drilled in the tube and bonded in place. Separate dielectric blocks (not shown) are used to hold the fibers in place. Power fiber pigtail 20 is aligned and mounted as described previously so as to optimally illuminate optical power converter 18. The power fiber pigtail and optical power converter are mounted as before on dielectric blocks, cemented to the support apparatus as shown. In other embodiments the antennas are three wire dipole antennas, the axis of which are mutually perpendicular, are supported, for example, using cement and small dielectric fixtures or supports. Separate dielectric bars (not shown), placed across the interior of the tube, cemented in place, support supporting apparatus 124. Operation for three-axis embodiments is similar to that for single-axis embodiments except that either the measurement apparatus is sequentially applied to each of the three photodetector unit outputs or else, three separate such measurement apparatus are used. Similar calibration methods, e.g. comprising three reference oscillators in the probe head are used.

Figure 18:
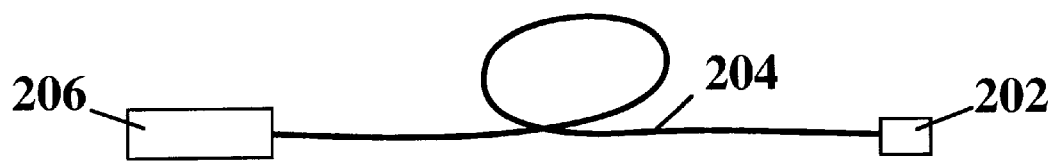
FIG. 18 is a block diagram of a general embodiment of the RF-field probe system.

In general terms, the present invention relates broadly to a photonic RF field probe (FIG. 18) comprising three principle parts: RF field probe head 202; optical power generating and detecting unit 206; and means of transporting light 204 between parts 202 and 206.

Figure 19:
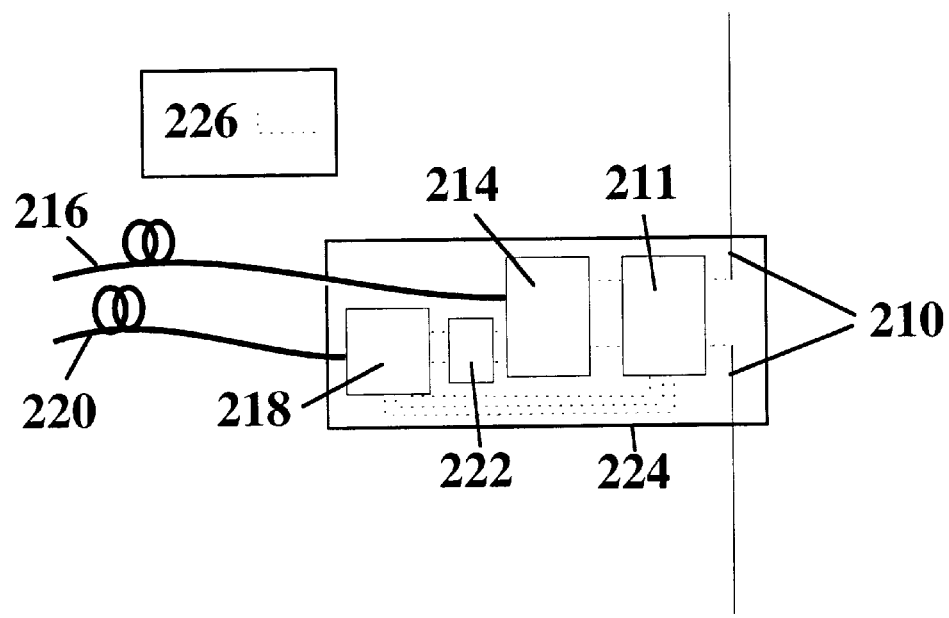
FIG. 19 is a block diagram of a general embodiment of the RF-field probe head.

The RF field probe head 202 is an assembly as shown in FIG. 19 which includes Part 210, which provides one or more means for converting, respectively, one or more components in different spatial directions of a radiated RF field into an electrical signals at individual Part-210 pairs of output terminals. Part(s) 211 provide one or more means of converting RF electrical signals, present at individual Part-210 pairs of input terminals, into an electrical signal, present at individual Part-211 pairs of output terminals, which is better suited for operation of Part(s) 214 when applied to Part-214 input terminals, including, in some embodiments, an electrical signal having higher electric current, voltage, and/or power, in which case Part(s) 211 have additional DC input terminals.

Part(s) 214 provide one or more means for modulating light in response to an electrical signal present at the individual Part(s)-214 input terminals or of producing light which is modulated in response to an electrical signal present at these input terminals. Part(s) 216 provide one or more means of transporting a large fraction of modulated light from Part(s) 214, and, possibly, of transporting light to Part(s) 214 from (a) remote source(s) of light, over a distance without appreciable loss or appreciable spreading of the light over dimensions transverse to the direction in which the light is being transported. Part 218 provides a means of converting light transported to it by Part 220 into DC electrical power avail able at Part-218 output terminals; Part 220, an additional means of transporting light over a distance without appreciable loss or appreciable spreading of the light over dimensions transverse to the direction the light is being transported.

Part(s) 222 provide one or more means for converting DC electrical signals present at individual pairs of Part-222 input terminals into an DC electrical signal for Part(s) 214. Parts 226 provide a means for transporting electrical signals and electrical power from the individual pair(s) of output terminals of Part(s) 210 to the individual pair(s) of input terminals of Part(s) 211, from individual pair(s) of the output terminals of Part(s) 211 to the individual pair(s) of input terminals of Part(s) 214, from the output terminals of Part 118 to the individual pair(s) of input terminals of Part(s) 212 and to DC input terminals of Part(s) 211, if needed. Parts 226 also provide, from the individual pair(s) of output terminals of Part(s) 122 to the individual pair(s) of input terminals of Part(s) 214, and Part 224, a means for maintaining the position of the other parts with respect to one another so that the photonic RF field probe head is able to function properly and/or optimally.

Optical power generating and detecting unit 106 comprises Part 170, a means of generating optical power, and Part 172, a means of converting optical signals into electrical signals. Means of transporting light 104 comprises a means of transporting a large fraction of light from Part 170 over some distance to Part 120 a means of transporting a large fraction of light from Part 116 over some distance to Part 172.

Thus, the photonic RF-field probe and calibration means thereof of the invention is relatively inexpensive for many reasons (e.g., the use of a chip laser diode in the probe head), small in size, and minimally-perturbing of the fields being measured (small size and mostly dielectric). The present invention is also advantageous because it needs no battery power to the probe head, is of simple construction, and is power efficient (important for applications such as larger phased arrays). The improved probe head is also made more accurate than prior art devices by the improved calibration methods disclosed here. It is highly sensitive (especially in embodiments with amplification in the probe head), and can measure electric or magnetic RF fields and the approximate temperature of the probe head's environment.

An example of a VCSEL having properties of the preferred signal laser diode is further described in K. L. Lear et al. "Small and large signal modulation of 850 nm oxide-confined vertical cavity surface emitting lasers," OSA TOPS Vol. 15 *Advances in Vertical Cavity Surface Emitting Lasers*, Connie Chang-Hasnain (ed.) Copyright Optical Society of America. An example of a laser having properties of the preferred power laser (in power-laser unit 70) is the SDL-2320-N2 from SDL, Inc. of San Jose, Calif. An example of the photodetector (in photodetector unit 72) is the Model 1431-50 from New Focus of Santa Clara, Calif.). Appropriate fiber coupler, monitor photodetector, RF amplifier, and DC power supplies used in the preferred embodiment of photodetector/power-laser unit 6 are avail able commercially from a variety of sources.

While the above description contains many specificities, these should not be construed as limitations on the scope of the invention, but rather as exemplification of one preferred embodiment thereof Many variations have been described and many others still are possible. Accordingly, the scope of the invention should be determined not by the embodiments illustrated but by the appended claims and their legal equivalents.

I claim:

1. An optical field probe for measuring an electromagnetic field comprising:
    probe head means for converting said electromagnetic field into modulated light signals;
    detector transport means connected to probe head means for transporting said modulated light signals to a location remote from said light modulating means;
    output means for receiving said transported modulated light signals and converting said modulated light signals into electrical output signals representing said electromagnetic fields; and
    calibration means for determining a relationship between said electrical output signals and said electromagnetic field while the field probe is measuring said electromagnetic field.

2. An optical field probe according to claim 1 wherein said calibration means comprises a calibration signal means for producing known modulated light signals.

3. An optical field probe according to claim 2 wherein said calibration signal means comprises:
    an electrical signal generator for generating an electrical signal; and
    means for supplying electrical power to said electrical signal generator.

4. An optical field probe according to claim 3 wherein means for supplying electrical power comprises:
    a light-source means for supplying a light; and
    a power-converter means for converting said light into electrical power and for providing said electrical power to said electrical signal generator.

5. An optical field probe according to claim 3 further comprising:

electrical network means for applying the electrical signal from said electrical signal generator without substantially affecting the relationship between said output signals and said electromagnetic fields.

6. An optical field probe according to claim 1 further comprising:

means for detecting a change in said relationship between said output signals and said electromagnetic fields; and means for correcting said output signals in response to a change detected by said means for detecting a change.

7. An optical field probe according to claim 1 wherein said probe head means further comprises:

means for generating a light located remote from said probe head means for generating light energy;

power conversion means associated with said probe head means for converting said light energy into DC electrical power to power said probe head means; and connecting means linking said light source means and said power conversion means for transporting said light energy from said light source means to said power conversion means.

8. An optical field probe according to claim 7 further comprising means of monitoring changes in said relationship between said output signals and said electromagnetic fields comprising:

means of providing an accurately known variation of the light generated by said light source means;

means of measuring changes in said output signals due to said variation of the light generated; and data relating changes in said output signals to said relationship between said output signals and said electromagnetic fields.

9. An optical field probe according to claim 1 further comprising:

means for supplying power for biasing said light modulation means, comprising a separate light-source means for supplying a light, and a power-converter means for converting said light into electrical power for biasing said light modulation means.

10. An optical field probe according to claim 9 wherein said calibration means comprises:

internal calibration means for detecting the relationship between said output signals and said electromagnetic fields in the absence of motion of said optical field probe and in the absence of calibrated electromagnetic field signals.

11. An optical field probe according to claim 10 wherein said internal calibration means comprises a calibration signal means connected to said light-source means.

12. An optical field probe according to claim 11 wherein said calibration means comprises an electrical signal generator.

13. An optical field probe according to claim 12 in which electrical power for said electrical signal generator is provided by light comprising:

a separate light-source means for supplying said light to power said electrical signal generator;

a power-converter means for converting said light into electrical power for said electrical signal generator.

14. An optical field probe according to claim 13 further comprising:

electrical network means for the purpose of applying the signal from said electrical signal generator to said light-source means without substantially affecting the relationship between said output signals and said electromagnetic fields.

15. An optical field probe according to claim 14 further comprising compensation means by which said output signals are corrected in response to changes in said relationship between said output signals and said electromagnetic fields.

16. An optical field probe according to claim 15 further comprising means of monitoring changes in said relationship between said output signals and said electromagnetic fields comprising:

means of providing an accurately known variation of the light modulation provided by said light modulation means;

means of measuring changes in said output signals due to said variation of the light modulation; and data relating said changes in said output signals to said relationship between said output signals and said electromagnetic fields.

17. An optical field probe according to claim 1 wherein said probe head means further comprises:

light source means remote from said probe head means for generating light energy;

power conversion means associated with said probe head means for converting said light energy into DC electrical power to power said probe head means; and connecting means for linking said light source means and said power conversion means and for transporting said light energy from said light source means to said power conversion means.

* * * * *